United States Patent
Pedretti et al.

(10) Patent No.: US 12,119,061 B2
(45) Date of Patent: Oct. 15, 2024

(54) STOCHASTIC LOCAL SEARCH ACCELERATOR BASED ON CAMS FOR SOLVING CONSTRAINT SATISFACTION PROBLEMS

(71) Applicant: HEWLETT PACKARD ENTERPRISE DEVELOPMENT LP, Houston, TX (US)

(72) Inventors: Giacomo Pedretti, Milan (IT); Tobias Frederic Ziegler, Houston, TX (US); Thomas Van Vaerenbergh, Diegem (BE); Catherine Graves, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 267 days.

(21) Appl. No.: 17/841,542

(22) Filed: Jun. 15, 2022

(65) Prior Publication Data
US 2023/0410903 A1 Dec. 21, 2023

(51) Int. Cl.
*G11C 15/04* (2006.01)
*G06F 3/06* (2006.01)
*G06F 16/33* (2019.01)
*H03K 19/20* (2006.01)

(52) U.S. Cl.
CPC .......... *G11C 15/046* (2013.01); *G06F 3/0604* (2013.01); *G06F 16/3341* (2019.01); *H03K 19/20* (2013.01)

(58) Field of Classification Search
CPC ....... G11C 15/046; G11C 15/04; H03K 19/20
See application file for complete search history.

(56) References Cited

U.S. PATENT DOCUMENTS

| | | | |
|---|---|---|---|
| 6,031,984 A | 2/2000 | Walser | |
| 7,171,393 B2 | 1/2007 | Naveh | |
| 7,587,376 B2 | 9/2009 | Sabato et al. | |
| 8,175,995 B2 | 5/2012 | Amin | |
| 8,751,984 B2 | 6/2014 | Safarpour et al. | |
| 9,547,821 B1 | 1/2017 | Loreggia et al. | |
| 10,180,053 B2 | 1/2019 | Hoeink | |
| 11,900,135 B1* | 2/2024 | Poplack | G06F 9/455 |
| 2006/0239053 A1* | 10/2006 | Burger | G11C 15/00 365/49.1 |
| 2010/0306308 A1 | 12/2010 | Andraus | |

(Continued)

FOREIGN PATENT DOCUMENTS

WO 2008/138100 A1 11/2008

*Primary Examiner* — Donald H B Braswell
(74) *Attorney, Agent, or Firm* — Dickinson Wright

(57) ABSTRACT

The disclosure generally provides for a method of solving a K-SAT problem. The method comprises programming one or more clauses of a Boolean expression for a K-SAT problem written in negated disjunctive normal form (DNF) to a ternary-CAM (TCAM) array comprising columns and rows of TCAM cells. The method further includes applying an interpretation comprising one or more binary variables expected to solve the Boolean expression as an input along the columns to the TCAM array, returning a binary value for each clause, randomly selecting one matched match line, determining a selected clause from one or more violated clause, and altering one or more literals within the interpretation using a break count for each variable of the selected clause.

20 Claims, 11 Drawing Sheets

(56) References Cited

U.S. PATENT DOCUMENTS

2013/0151444 A1    6/2013  Blaschko et al.
2015/0341270 A1*  11/2015  Basso .................. H04L 47/196
                                                      711/108
2017/0133104 A1*   5/2017  Darbari ............... G06F 11/3409
2022/0261664 A1*   8/2022  Cheriton ................ G16H 50/20

\* cited by examiner

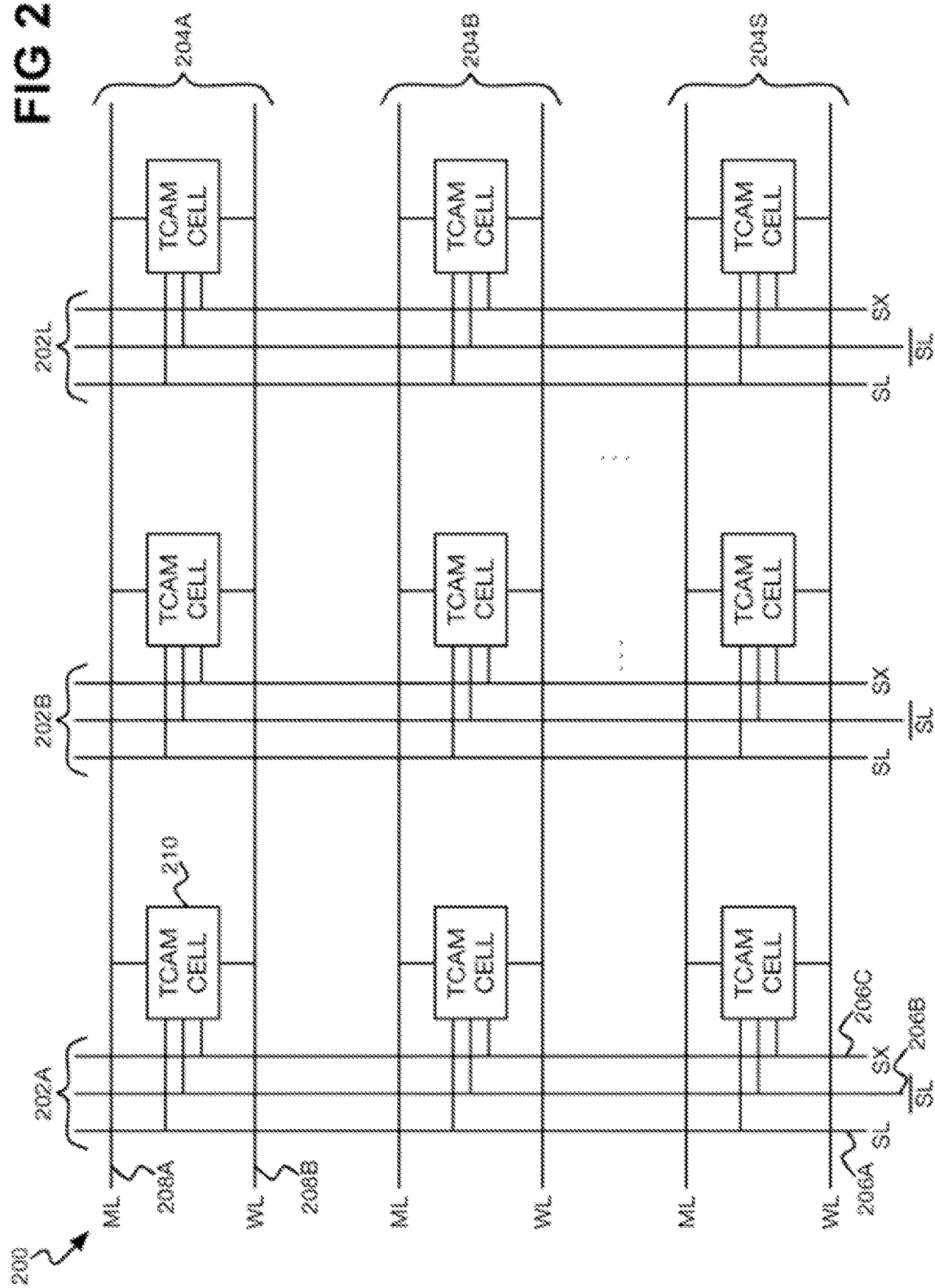

STOCHASTIC LOCAL SEARCH ACCELERATOR BASED ON CAMS FOR SOLVING CONSTRAINT SATISFACTION PROBLEMS

STATEMENT OF GOVERNMENT RIGHTS

This invention was made with Government support under Agreement No. FA8650-23-3-7313, awarded by AFRL. The Government has certain rights in the invention.

BACKGROUND

Boolean satisfiability problems (i.e., propositional satisfiability problems abbreviated as Satisfiability, SAT, or B-SAT) are problems to determine whether an interpretation exists to satisfy a given Boolean formula. For example, a SAT problem attempts to determine whether the variables of a given Boolean formula can be consistently replaced by the values True or False in such a way that the formula evaluates to True. If this is the case, the formula is called satisfiable. On the other hand, if no such assignment exists, the function expressed by the formular is False for all possible variable assignments and the formula is unsatisfiable. For example, the formula "a AND NOT b" is satisfiable because the values a=True and b=False would make the formula "a AND NOT b"=True. In contrast, "a AND NOT a" is unsatisfiable. SAT is the first problem that was proved to be NP-complete. All problems in the NP-complexity class (which includes a wide range of natural decision and optimization problems) are at most as difficult to solve as SAT. One or more clauses of a Boolean expression for the SAT problem can be programmed to a respective cell of a row of a content addressable memory ("CAM"). A CAM is a type of computing memory in which the stored data is not accessed by its location, but rather by its content. A word, or "tag", is input to the CAM. The CAM searches for the tag in its contents and, when found, the CAM return the address of the location where the found contact reside. CAMs are powerful, efficient, and fast. However, CAMs are also relatively large, consume a lot of power, and are relatively expensive. These drawbacks limit their applicability to select applications in which their power, efficiency, and speed are sufficiently efficient CAMs based on non-volatile memory technology have been used for in-memory computing in multiple applications such as pattern matching, artificial intelligence, and machine learning.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 2 shows an example ternary content-addressable memory (TCAM) that can be used as a k-SAT verification circuit.

Figure 1:
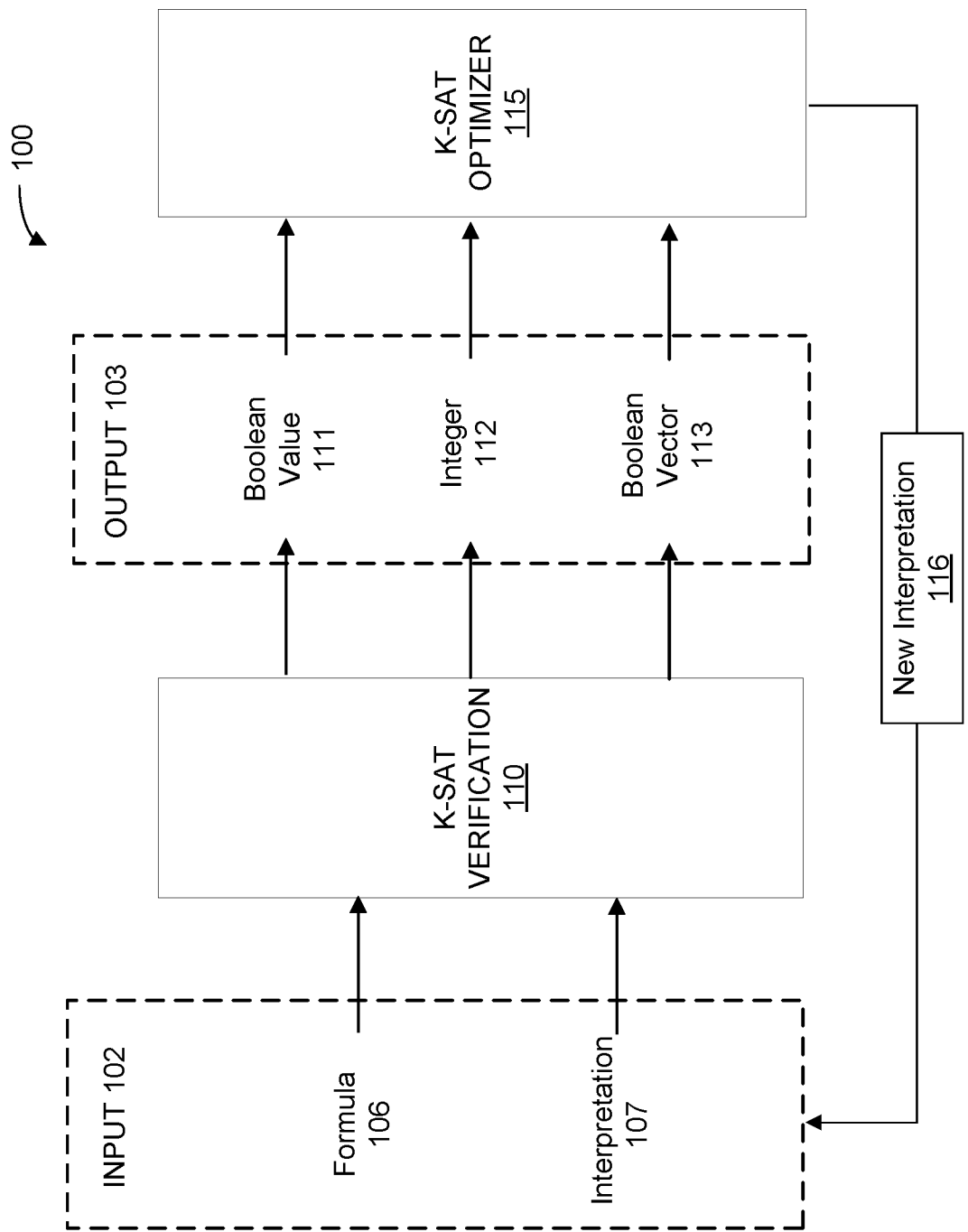
FIG. 1 shows an example of a K-SAT solver that includes a K-SAT verification block and a K-SAT optimizer.

The figures are not exhaustive and do not limit the present disclosure to the precise form disclosed.

DETAILED DESCRIPTION

Boolean satisfiability problems (i.e., propositional satisfiability problems abbreviated as Satisfiability, SAT, or B-SAT) are problems to determine whether an interpretation exists to satisfy a given Boolean formula. For example, a SAT problem attempts to determine whether the variables of a given Boolean formula can be consistently replaced by the values True or False in such a way that the formula evaluates to True. If this is the case, the formula is called satisfiable. On the other hand, if no such assignment exists, the function expressed by the formula is false for all possible variable assignments and the formula is unsatisfiable. For example, the formula "a AND NOT b" is satisfiable because the values a=True and b=False would make the formula "a AND NOT b"=True. In contrast, "a AND NOT a" is unsatisfiable. SAT is the first problem that was proved to be NP-complete. All problems in the NP-complexity class (which includes a wide range of natural decision and optimization problems) are at most as difficult to solve as SAT.

A k-SAT problem is characterized by the number of variables V, the number of literals k and the number of clauses C. A literal is either a variable or the negation of a variable. A clause is made of k literals. Conjunctive normal form, or CNF, (in particular with k=3 literals per clause) is often considered the canonical representation for SAT formulas. In CNF formation, a clause is a disjunction (logical OR operation) of literals (or a single literal). A formula is a conjunction (logical AND operation) of clauses (or a single clause). A formula can also be represented by the disjunctive normal form (DNF) where the clause is a conjunction of literals and the formula is a disjunction of the clauses.

CAMs can be implemented in technologies that permit the CAM to hold its contents even when power is lost or otherwise removed. Thus, the data stored in a CAM can persist and can act as "non-volatile memory". These technologies include, for example, resistive switching memory (i.e., memristor), phase change memory, magnetoresistive memory, ferroelectric memory, and other resistive random access memory devices, or combinations of those technologies.

CAMs can be categorized as "binary" or "ternary." A binary CAM ("BCAM") operates on an input pattern containing binary bits of zero and one. A ternary CAM ("TCAM") operates on an input pattern (and stores data) containing not only binary bits of zero and one, but also an "X" value. An "X" is sometimes referred to as a "don't care" or a "wildcard." In a search on the input pattern in a TCAM, an "X" will return a match on either a zero bit or a one bit. Thus, a search on the input pattern "10X1" will return a match for both "1001" and "1011." Note that both BCAMs and TCAMS use and operate on binary values of zero and one. CAMs are digital in that the data is stored in the CAM as binary values in a memory (e.g., SRAM, memristor, etc.) and the input patterns are represented by zeros and ones. Each memory cell in the CAM processes one value at a time (either 0/1 or 0/1/X), which limits the memory density and the power efficiency.

FIG. 1 is an example architecture of a K-SAT verification and solution technique, according to one embodiment. The example architecture 100 includes a K-SAT verification block 110 (i.e., K-SAT verification circuit), and a K-SAT optimizer 115. As seen in FIG. 1, an input 102 is applied to the K-SAT verification block 110. The input 102 includes a formula (e.g., a CNF or DNF expression) 106 comprising a plurality of clauses comprising k literals, and an interpretation (e.g., guess). The interpretation includes a set of variables that can be applied to the K-SAT problem to test/check if the variables satisfy the clauses. In one embodiment, if the variables do not satisfy each clause, the number of violated clauses can be counted. An output 103 from the K-SAT verification block 110 can include any one of: a Boolean value 111 (e.g., a value representing True or False); an integer 112; and a Boolean vector 113 of the Boolean expression. The Boolean value 111 can be used to represent if all the clauses are satisfied or not. The integer 112 can be used to represent the number of violated clauses of the interpretation. The output can also include a Boolean vector 113 which represents the index of TCAM rows where a violated clause is stored. As seen in FIG. 1, the output of the K-SAT verification block 110 is sent to and received by the K-SAT optimizer 115. The K-SAT optimizer 115 uses the output to generate an updated (i.e., new) interpretation 116 that can be applied as an input 102 to the K-SAT verification block 110 to satisfy more clauses than the previous input.

FIG. 2 shows an example ternary content-addressable memory (TCAM) 200 that can be used as k-SAT verification block 110. The TCAM 200 is programmed in correspondence with the k-SAT formula 106 so that the TCAM 200 can be used to test the interpretation 107 against the k-SAT formula 106 within the block (i.e., TCAM cell 210). The TCAM 200 is a type of content-addressable memory (CAM).

Specifically, in typical, non-CAM computer memory, such as random-access memory (RAM), the contents or data stored in the memory are looked up by memory address. By comparison, within a CAM, the memory is content addressable. To search the CAM, content is provided, instead of a memory address. A CAM may be a binary CAM, which can just match binary values, such as logic zero and logic one. By comparison, a TCAM can match and store values based on three inputs: logic zero, logic one, and a "don't care" state.

The TCAM 200 includes input column line groups 202A, 202B, . . . , 202L, which are collectively referred to as the input column line groups 202. The number of column line groups 202 is equal to the number V of variables within the total set of variables $x_1, x_2, \ldots, x_L$, to which any formula 106, or interpretation 107, of FIG. 1 can be set, either identically or as a negative thereof. The column line group 202 respectively correspond to the variables $x_1, x_2, \ldots, x_L$.

The TCAM 200 includes row line pairs 204A, 204B, . . . , 204S, which are collectively referred to as the row line pairs 204. The number of row line pairs 204 is equal to the number S of k-SAT clauses which compose the formula 106 in FIG. 1. The row line pairs 204 respectively correspond to the k-SAT clauses which compose a formula 106.

Each input column line group 202 includes a search line 206A, or SL, and an inverted search line 206B, or SL and can also include in some implementations of a TCAM a "don't care" line 206C, or SX. Each row line pair 204 includes a match line 208A, or ML, and a write line 208B, or WL. The lines 206A, 206B, and 206C are collectively referred to as the lines 206, and the lines 208A and 208B are collectively referred to as the lines 208.

A TCAM returns a match on a given row ML (True value) if all of the values stored in each TCAM cell on a row are equal to the value given as an input to the SL/and SL negated. Thus, the TCAM is performing a bitwise AND operation between the XNOR of each TCAM cell's stored value and its corresponding input.

Each TCAM cell 210 may be implemented by memristors, in which case the TCAM 200 is a memristor-implemented TCAM. For example, each TCAM cell 210 may be implemented by one or two memristors. An example of such a two memristor-implemented TCAM cell that uses four transistors is described in L. Huang et al., "ReRAM-based 4T2R non-volatile TCAM with a 7×NVM-stress reduction, and 4× improvement in speed word length-capacity for normally-off instant-on filter-based search engines used in big-data processing," VLSI Symposium, June 2014, pp. 99-100. An example of a one memristor-implemented TCAM that uses three transistors is described in M. Chang et al., "A 3T1R non-volatile TCAM using MLC ReRAM with sub-1 ns search time," 2015 IEEE International Solid-State Circuits Conference, 2015, pp. 1-3.

The TCAM cells 210 are programmed to correspond with the variable assignments of the k-SAT clause in formula 106. As seen in FIG. 2, the input column (i.e., input column line group 202) corresponds to the total number of V variables. Each TCAM cell 210 is disposed between corresponding input column line groups 202 and corresponding output row line pairs 204.

For example, the column line group 202B can correspond to the second variable $x_2$ of the total set of V variables $x_1, x_2, \ldots, x_V$, and thus to the variable assignment corresponding to this variable $x_2$. For example, the row line pair 204S can correspond to the last, or s-th, k-SAT clause, thus indicating if the s-th clause is satisfied or not.

In one embodiment, the TCAM cell comprises a four transistor and two memristor (4T2M) TCAM cell, with a first transistor T1 connected to a first data line SL and a second transistor T2 connected to a second data line SL. The first memristor is connected to the first transistor T1 and the second memristor M2 is connected to the second transistor T2. The first and second memristors M1, M2 are connected in series to form a resistive divider, with the output voltage of the resistive divider (i.e., voltage on common node G) being applied to the gate of a match-line transistor T4 to control whether to switch the match-line transistor T4 to pull down the voltage on match line ML. The third transistor T3 works in concert with the first transistor T1 and/or second transistor T2 for programming the memristors M1, M2. Furthermore, utilizing a TS memristor in accordance with the technology disclosed herein, the same operation is attainable with three transistors, reducing the size and power consumption of the cell.

Although discussed with respect to memristor-based example CAMS, the technology disclosed herein is not limited only to memristor-based CAMs but is directly applicable to conventional static random access memory (SRAM)-based CAMs, realized with conventional complementary metal oxide semiconductor (CMOS) technologies. Traditional SRAM-based CAM cells comprise a total of sixteen transistors comprising storage and memory circuitry. The issue of subthreshold leakage is present in any situation where a large number of transistors are present and associated with a common match line. The impact of subthreshold leakage in this environment limits the potential size of data words that can be effectively stored and searched to only 8- or 16-bits.

Given that each CAM/TCAM row performs a bitwise AND operation between the XNOR of each stored value in a CAM/TCAM and its corresponding input, k-SAT problems in a negated DNF formulation can be mapped on a CAM/TCAM. Thus, the CAM/TCAM can be used to verify which clauses are satisfied by an input interpretation.

Mapping includes programming the Boolean expression into the CAM. Specifically, each clause of a DNF Boolean expression can be mapped (e.g., programmed) into a plurality of CAM cells according to a mapping order. Thus, the inherent AND properties of the CAM can be used to help the solver solve the K-SAT problem. For example, because a negated DNF Boolean expression includes a plurality of clauses connected by an OR, each clause, comprising a plurality of literals separated by ANDs, can be mapped a row to the CAM, can be separated into a plurality of rows without disturbing the DNF Boolean expression. Once the DNF expression is mapped into rows, each variable within the row can be arranged in a column, so that a guess can be applied to each variable via each column.

Figure 3A:
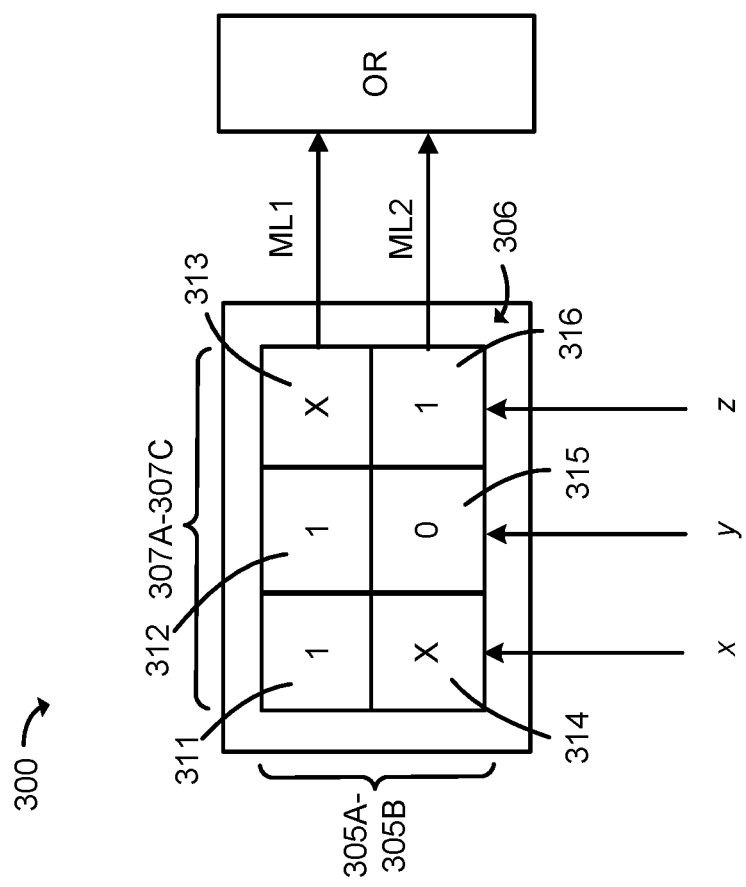
FIGS. 3A-3B illustrate an example of a 3-SAT negated DNF Boolean Expression mapped on a TCAM.
Figure 3B:
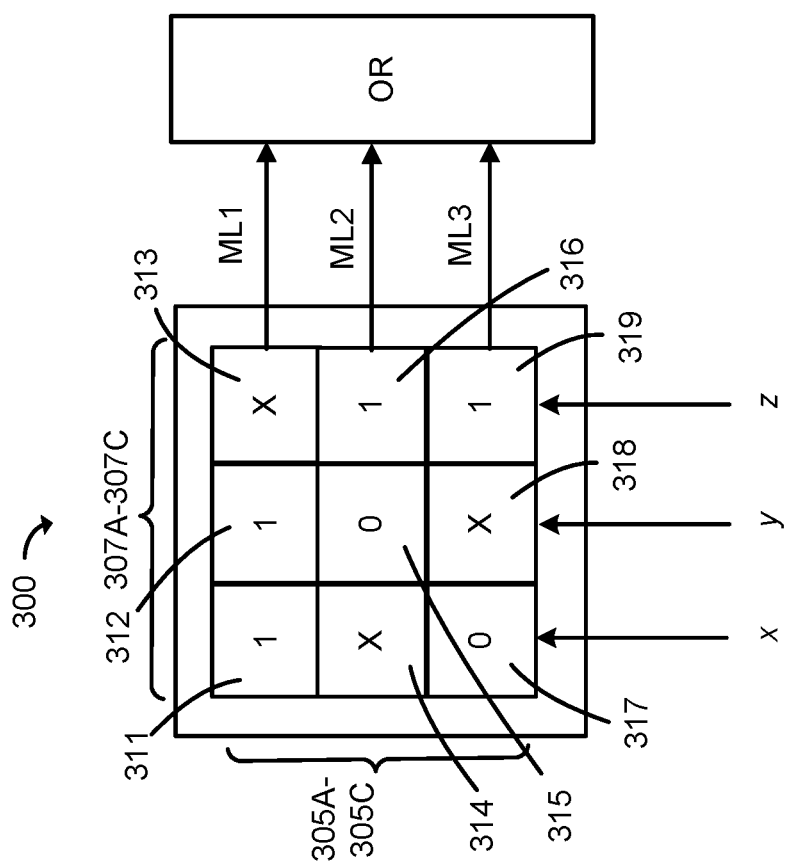

As seen in FIGS. 3A-3B, the TCAM includes a plurality of columns 307 and rows 305. Each clause of the negated DNF Boolean expression can be mapped onto a row 305 of the plurality of CAM cells 306 according to a mapping order. In one embodiment, the mapping order includes programming a first clause that includes a plurality of literals onto a first row 305A, and programming a second clause that includes a plurality of literals onto a second row 305B. Each of the plurality of literals, further include a first value assigned to each non-negated literal (e.g., z), and a second value assigned to each negated literal (e.g. ¬z).

As seen in FIG. 3A, an exemplary 2-SAT problem is mapped to a TCAM. Here, the 2-SAT problem includes two literals (i.e., k=2), three variables (i.e., V=3) and two clauses (i.e., C=2). In this example, the TCAM includes an array of cells that include two rows and three columns. Each clause is mapped to a row of the TCAM. For example, the first clause is mapped to the first row 305A, and the second clause is mapped to the second row 305B. Furthermore, each column of the TCAM includes a variable (e.g., 1, 0, or X). Each clause has k literals chosen between the V variables. In this example, each clause includes two literals. Non-negated literals are programmed as 1 in the corresponding TCAM cell and negated literals are programmed as 0 in the corresponding TCAM cell. Variables not presented in the clause are programmed as 'X' (don't care) in the corresponding TCAM cell.

For example, as seen in FIG. 3A, the expression: $\bar{f}=(x \wedge y) \vee (\neg y \wedge z)$ which represents the negated DNF of a given formula, can be programmed (i.e., mapped) onto a CAM. In this example, the first clause (x∧y) is mapped to a first row 305A, and the second clause (¬y∧z) is mapped to the second row 305B. Each literal within each clause is mapped to its own respective column 307A-C. For example, x of the first and second clause is mapped to the first column 307A, y of the first and second clause is mapped to the second column 307B, and z is mapped to the third column 307C. Furthermore, as previously mentioned, each literal is assigned a bit value (ternary 0 or 1 or X) depending on whether the literal is a negated, non-negated, or absent literal not present in the clause. Here, a negated literal is assigned a bit value of 0, a non-negated literal is assigned a bit value of 1, and an absent literal is assigned a bit value of 'X' (don't care). For example, the first clause includes the literals x,y. The values of x,y are mapped to the CAM such that x is represented in cell 311 as a 1,y is represented in cell 312 as 1 and z is represented in cell 313 as a "X". As seen further in FIG. 3A, the second clause (¬y∧z) is mapped to the second row 305 of the CAM, such that x is represented in cell 314 as "X", ¬y is represented in cell 315 as "0" and z is represented in cell 316 as a "1". Thus, as seen in FIG. 3A, the first clause (x∧y) of the negated DNF Boolean expression $\bar{f}=(x \wedge y) \vee (\neg y \wedge z)$ is represented as 1 1 X in the first row, and the second clause (¬y∧z) is represented as X 0 1 in the second row.

As seen further in FIG. 3A, each row includes a match line (ML). For example, the cells 311-313 in the first row 305A include a first ML, and the cells 314-316 in the second row 305B include a second ML.

The solver applies each variable of the interpretation (i.e., input) to each column in parallel to determine which clause is satisfied. A satisfied clause corresponds to a ML output equal to 0. For example, as seen in FIG. 3A, if the interpretation [1 1 0] is applied as input then ML1 would return a ML high value (e.g, a high order bit value 1). Here, ML1 would return a ML high value because each variable of the interpretation (i.e., input values) matched the values stored in cell 311, 312 and 313 respectively. In addition, ML2 would return a ML low value (e.g., low order bit value 0) since the interpretation [1 1 0] mismatched the values stored in cells 314, 315 and 316. Thus, the first clause is not satisfied, while the second is satisfied. In addition, in another example, if the interpretation [0 0 0] is applied as input, ML1 and ML2 would return a ML low value (e.g, a low order bit value 0), since interpretation mismatched the value stored in cells 311, 312, 313, 314, 315 and 316. Since both MLs (ML1 and ML2) return a low value, both clauses are satisfied.

A complete truth table (i.e., Truth Table 1) for the Boolean expression of FIG. 3A is shown below. A given k-SAT problem is solved when $\bar{f}=0$ (f=1). To verify that the ML of each row can be coupled to an OR gate to verify if the Boolean expression is satisfied. As seen in FIG. 3B, the OR gate can accommodate any number of MLs. For example, if three clauses are mapped to three rows of a CAM, then three MLs would be coupled to an OR gate.

| | | | Truth Table 1 | | | |
|---|---|---|---|---|---|---|
| x | y | z | f | $\bar{f}$ | ML1 | ML2 |
| 0 | 0 | 0 | 1 | 0 | 0 | 0 |
| 0 | 0 | 1 | 0 | 1 | 0 | 1 |
| 0 | 1 | 0 | 1 | 0 | 0 | 0 |
| 0 | 1 | 1 | 1 | 0 | 0 | 0 |
| 1 | 0 | 0 | 1 | 0 | 0 | 0 |
| 1 | 0 | 1 | 0 | 1 | 0 | 1 |
| 1 | 1 | 0 | 0 | 1 | 1 | 0 |
| 1 | 1 | 1 | 0 | 1 | 1 | 0 |

In an alternative embodiment, analog values of each ML are passed through an analog adder. The analog adder combines the analog values (i.e., non-binary signals) of each ML to calculate a sum value. The sum of the analog values is returned as an output (e.g., output 103) that can be used to by the K-SAT optimizer 115 to solve the K-SAT problem.

FIG. 3B is an example of three clauses mapped to a CAM. As previously mentioned, each clause is mapped to a row, and each literal within each clause is mapped to a column.

For example, if the interpretation [0 1 1] is applied at the input to the CAM mapped with a first clause (x∧y), a second clause (¬y∧z) and a third clause (¬x∧z) ML1 and ML2 would both return a low output, while ML3 would return a high output. Since ML3 returned a high output, the third clause is not satisfied.

For example, as seen in FIG. 3B, if the interpretation [0 0 1] is applied as an input then ML1 would return a ML low value (e.g, a low order bit value 0) since the interpretation [0 0 1] mismatched the values stored in cells 311, 312 and 313. Here, ML2 and ML3 would both return a ML high value because each variable of the interpretation (i.e., input values) matched the values stored in cell 314, 315, 316, 317, 318, and 319 respectively. Thus, in this example, the first clause is satisfied, while the second and third are not. A complete truth table (i.e., Truth Table 2) for the Boolean expression of FIG. 3B is shown below.

Truth Table 2

| x | y | z | f | f̄ | ML1 | ML2 | ML3 |
|---|---|---|---|---|-----|-----|-----|
| 0 | 0 | 0 | 1 | 0 | 0   | 0   | 0   |
| 0 | 0 | 1 | 0 | 1 | 0   | 1   | 1   |
| 0 | 1 | 0 | 1 | 0 | 0   | 0   | 0   |
| 0 | 1 | 1 | 0 | 1 | 0   | 0   | 1   |
| 1 | 0 | 0 | 1 | 0 | 0   | 0   | 0   |
| 1 | 0 | 1 | 0 | 1 | 0   | 1   | 0   |
| 1 | 1 | 0 | 0 | 1 | 1   | 0   | 0   |
| 1 | 1 | 1 | 0 | 1 | 1   | 0   | 0   |

Figure 4:
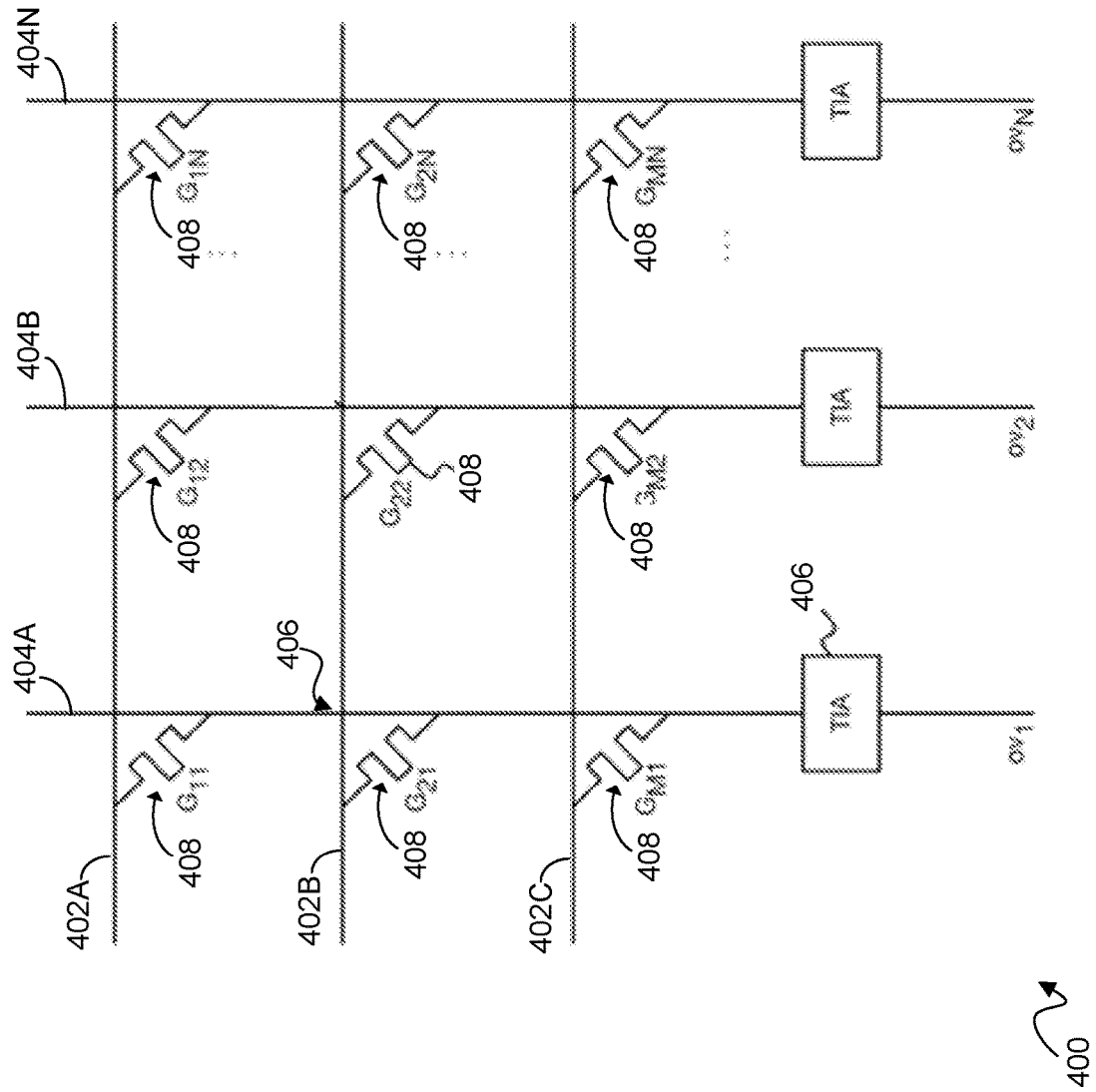
FIG. 4 shows an example memristor-implemented dot product engine that can be used to determine the amount of times each variable violates a constraint.

FIG. 4 shows an example memristor-implemented dot product engine 400 that can be used to determine the number of clauses violated by each variable. The dot product engine 400 has M number of rows 402A, 402B, . . . , 402N, which are collectively referred to as the rows 402. The dot product engine 400 has N number of columns 404A, 404B, . . . , 404N, which are collectively referred to as the columns 404. At each intersection 406 of a row 402 and a column 404, the dot product engine 400 includes a memristor 408. The memristor 408 at each intersection 406 is more generally referred to as a memristor element, insofar as there may be more than one memristor at each intersection 406 to store a data value.

Analog input voltages $iv_1, iv_2, \ldots, iv_M$ are applied to the rows 402, and constitute a vector IV of the input voltages. Output voltages $OV_1, OV_2, \ldots, OV_N$ are provided at the outputs of transimpedance amplifiers (TIAs) 406 on the columns 404, and constitute a vector O V of the output voltages. The memristor 408 at the intersection of row x and column y has a programmed value, such as an analog conductance corresponding to an analog value, equal to $G_{xy}$. The output voltage $OV_y$ for the y-th column 404 is equal to the sum of the products $iv_x \cdot G_{xy}$ over the rows X=1 . . . M. That is, $$ov_y = \sum_{x=1}^{M} iv_x \cdot G_{xy}$$

The memristors 408 within the column y makes up a vector $\{G_{xy}\}$, X=1 . . . M. The output voltage $OV_y$ is therefore the dot product of the vector IV of the input voltages $iv_1, iv_2, \ldots, iv_M$ and this vector {Gxy}. The memristors within all the rows x and all the columns y make up a matrix {Gxy}, for X=1 . . . M and y=1 . . . N.

Figure 5A:
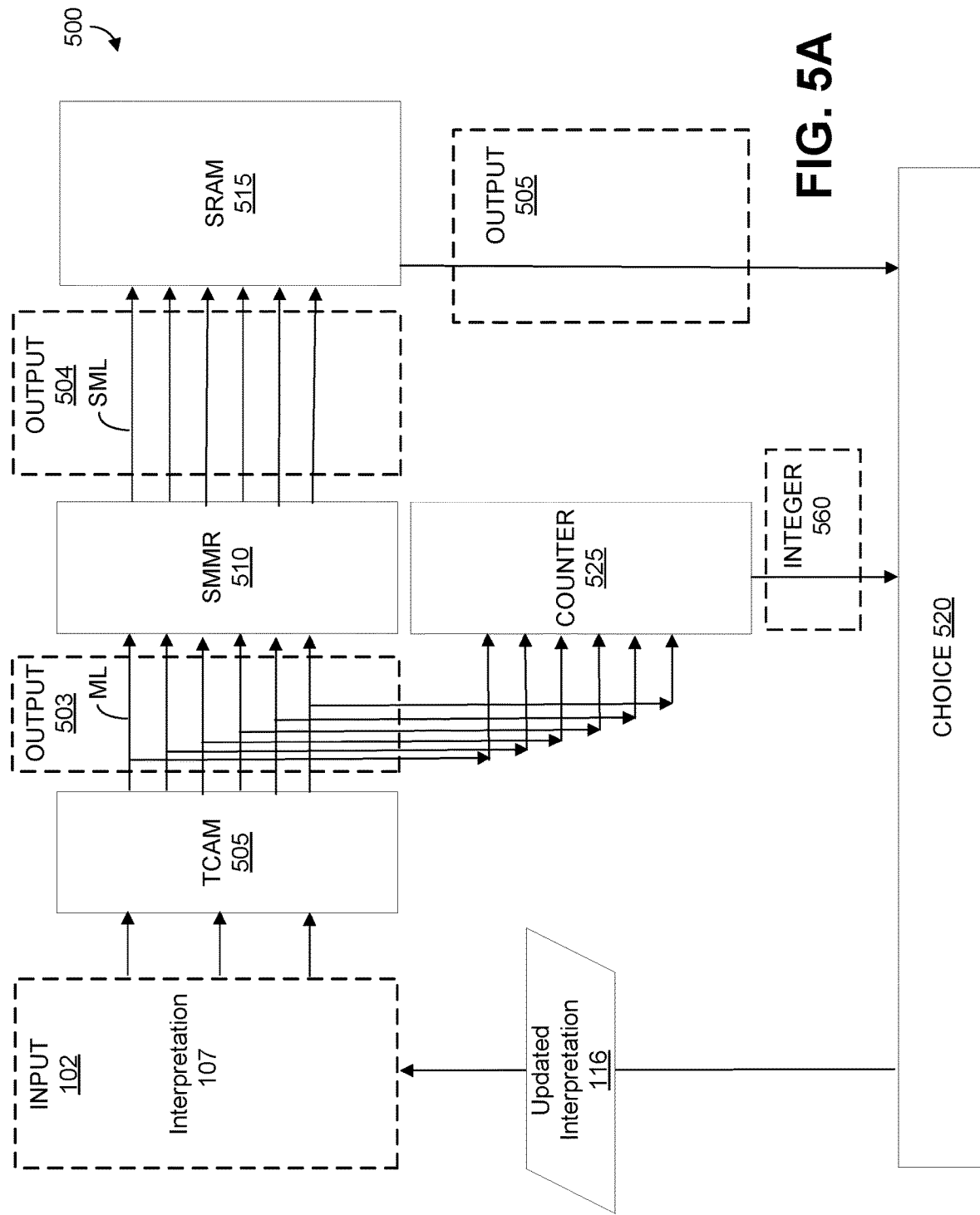
FIGS. 5A-5B show an example architecture of a K-SAT verification and solution technique, according to one embodiment.

FIG. 5A shows an example architecture 500 of a K-SAT verification and solution technique, according to one embodiment. The example architecture 500 includes a ternary content-addressable memory (TCAM) 505, a stochastic multiple match resolver (SMMR) 510, a counter 525, a static random-access memory (SRAM) 515, and a choice block 520. As seen in FIG. 5, the TCAM 505, SMMR 510, counter 525, SRAM 515, and choice block 520 are all electrically coupled to one another respectively via a plurality of buses to create a feedback loop.

The TCAM 505 includes a TCAM array comprising columns and rows of TCAM cells. One or more clauses of a Boolean expression for a K-SAT problem written in disjunctive normal form (DNF) can be programmed to the TCAM array. Programming each clause of the Boolean expression for the K-SAT problem written in disjunctive normal form (DNF) includes programming a bit value that includes a 0, 1, or X to each cell within each TCAM array, wherein the X represents a don't care value. Each occurring variable of each clause is mapped to a respective TCAM cell of the row, and each non-occurring variable is programmed as a don't care value. Specifically, each negation of each literal in each clause is assigned a bit value of 0, each non-negation of each literal in each clause is assigned a bit value of 1, and each absent variable in each clause is assigned a bit value of X. Each row of TCAM cells in the TCAM array includes a match line (ML).

In one embodiment, the TCAM 505 is configured to receive an input 102 from the choice block 520. The input 102 includes an interpretation 107 (e.g., guess) comprising one or more binary values expected to solve the Boolean expression as an input along the columns to the TCAM array. The interpretation 107 includes one or more binary variables expected to solve the binary expression. Here, the TCAM 505 uses the interpretation 107 to test/check if the input variables satisfy the mapped clauses. The interpretation 107 is applied as an input along the columns of the TCAM array to determine whether one or more clauses are satisfied. A satisfied clause corresponds to a ML output 503 equal to 0. A violated clause (i.e., a non-satisfied clause) corresponds to a ML output 503 equal to 1. The one or more binary variables can be applied to the K-SAT problem to test/check if the variables satisfy at least one clause. For example, in one embodiment, the interpretation 107 can include a guess applied as an input along the columns of the TCAM array to determine whether one or more clauses are satisfied. As previously mentioned, Boolean satisfiability problems (i.e., propositional satisfiability problems abbreviated as Satisfiability, SAT, or B-SAT) are problems to determine whether an interpretation exists to satisfy a given Boolean formula. In one embodiment, the choice block 520 applies the interpretation 107 to each column to determine which clause is satisfied.

As previously mentioned, each row of TCAM cells in the TCAM is connected to a respective match line (ML). In one embodiment, if an interpretation matches the values stored in a row, the ML of that row will return a value associated with a true condition (e.g., ML returns TRUE, or a high bit value 1). If an interpretation mismatches the values stored in each row, the ML of that row will return a value associated with a false condition (e.g., ML returns FALSE, or a low bit value 0). For example, if all of the values stored in each TCAM cell on a row are equal to the value given as an interpretation (i.e., input) to the SL/and SL negated then the TCAM will return a match on a given row's ML (True value). Thus, the TCAM is performing a bitwise AND operation between the XNOR of each TCAM cell's stored value and its corresponding input.

The SMMR 510 is configured to receive the output 503 from the TCAM 505. Here, the SMMR 510 uses the output 503 from the TCAM to stochastically select one or more violated clauses. For example, in one embodiment, the SMMR 510 can randomly select one violated clause index. The violated clause index is represented by the Boolean value TRUE in the Boolean vector 113, which corresponds to the output 503 of the TCAM. A satisfied (i.e., non-violated) clause index is represented by a Boolean value FALSE in the Boolean vector 113, which corresponds to the output 503 of the TCAM. In one embodiment, the SMMR 510 uses the output 503 to randomly select one of the high match lines (MLs). The one randomly selected high ML is sent as a vector through the bus to the SRAM 515. Specifically, once the SMMR 510 randomly selects the one high match line it returns a one-hot vector on a selected match line (SML). The one-hot vector has the same dimension of ML but includes only one element that is high. For example if input MLs 1, 7, and 8 are high, the SMMR will randomly select between one of the high MLs and return a SML value of 1 as the output 504. All other MLs would be returned as 0s in the SML (i.e., if 1, 7 and 8 are high, and the SMMR randomly selects ML 7, then the SML will return a value of 1 for ML7, and a value of 0 for ML 1 and 8 as the output 504). Thus, the SML will have only one high value. As explained further below, each SML is communicatively coupled to each wordline (WL) of the SRAM 515.

The SRAM 515 is configured to receive the output 504 from the SMMR 510. Because each SML is communicatively connected to each wordline (WL) of the SRAM 515, the SRAM 515 can use the output 504 to return (e.g., send) one of the violated clauses to the choice block 520. Specifically, the SRAM 515 stores the same clauses that are stored on the TCAM 505. The SRAM assigns a value of 1 if there is a variable present and 0 if there is not a variable present in the clause. For example, for a 3-SAT problem with 10 variables, if the clause includes $X_1$, $X_7$, $X_8$, the corresponding SRAM row would be programmed with all 0s (e.g., $X_2$, $X_3$, $X_4$, $X_5$, $X_6$, $X_9$, and $X_{10}$) except three 1s ($X_1$, $X_7$, $X_8$) where there is a variable in the clause. The SML vector is directly connected to the SRAM row. The clause stored in SML1 (selected high) is retrieved from the SRAM. The retrieved clause is referred hereafter as the "selected clause". For example, since the SML has only one active high value, that high value would be connected to a WL of the SRAM 515, and the SRAM would return one "selected clause" as an output 505. In one embodiment, the SRAM returns the selected clause as the violated clause itself. The selected clause is sent as an output 505 to the choice block 520 where the WalkSat algorithm can be applied to the selected clause to determine which variable to alter (i.e., flip). Thus, the SRAM can then be used to determine the variables of one violated clause that was stochastically selected by the SMMR.

The choice block 520 is configured to receive the output 505 from the SRAM 515. Here, the choice block 520 includes a circuit that is configured to use the output 505 to make a decision on which variable to alter (i.e., flip) from the selected clause. In one embodiment, the choice block uses a WalkSAT algorithm to determine which variable to alter. In one embodiment, altering (i.e., flipping) the variable includes creating a reciprocal value and applying the reciprocal value of the variable to each clause to determine a number of violated clauses.

The WalkSAT algorithm is a local search algorithm that applies an interpretation to a device (e.g., TCAM), and alters one variable of the interpretation to see if the output is altered (e.g., a clause is satisfied or non-satisfied). The WalkSAT search algorithm then alters one or more variables of the interpretation based on the output. For example, the choice block 520 can apply the WalkSAT search algorithm to a random clause to calculate how many clauses are violated by each variable when the variable is flipped. The number of clauses that are violated for each variable is referred to as the break count. The break count can be used to represent how many clauses are violated by flipping that particular variable. A break count exists for each variable based on the results on the alteration (i.e., flip). Here, the break count includes an integer 560 (e.g., a number) as an output from the counter 525. The integer 560 includes the number of violated clauses. Thus, the break count of a particular updated interpretation 116 includes the integer 560 as an output from the counter 525.

In one embodiment, the choice block 520 alters (i.e., flips) a variable based on the break count. Specifically, the WalkSAT algorithm includes starting with a random interpretation, computing unsatisfied clauses, and picking a random clause. For example, if the break count of a variable is equal to zero, then the variable is flipped. Otherwise, the choice block 520 randomly chooses between flipping the variable with a minimal break count or flipping a random variable (e.g., a random value (RND) from 0 to 1). If RND is less than a hyperparameter (P) then a random variable is flipped. Otherwise, the variable with the minimal break count is flipped. For example if a 3-SAT problem is encoded, the output of the SRAM is a vector with all 0s except for three values that are in a particular clause. The choice block 520 would check the break count for the three variables that correspond to flipping the first variable and querying the TCAM 505 to determine the number of violated (i.e., mismatched) clauses (e.g., how many 0s are in the ML). The choice block 520 would then flip a variable and repeat the process. This process is repeated to determine which variables result in getting closer to the solution and which variables result in getting further from the solution. Thus, once the choice block 520 decides which variable to flip, it generates an updated interpretation 116 that includes the flipped variable. The updated interpretation is then applied as an input 102 to the TCAM 505 to satisfy one or more clauses of the formula.

Figure 5B:
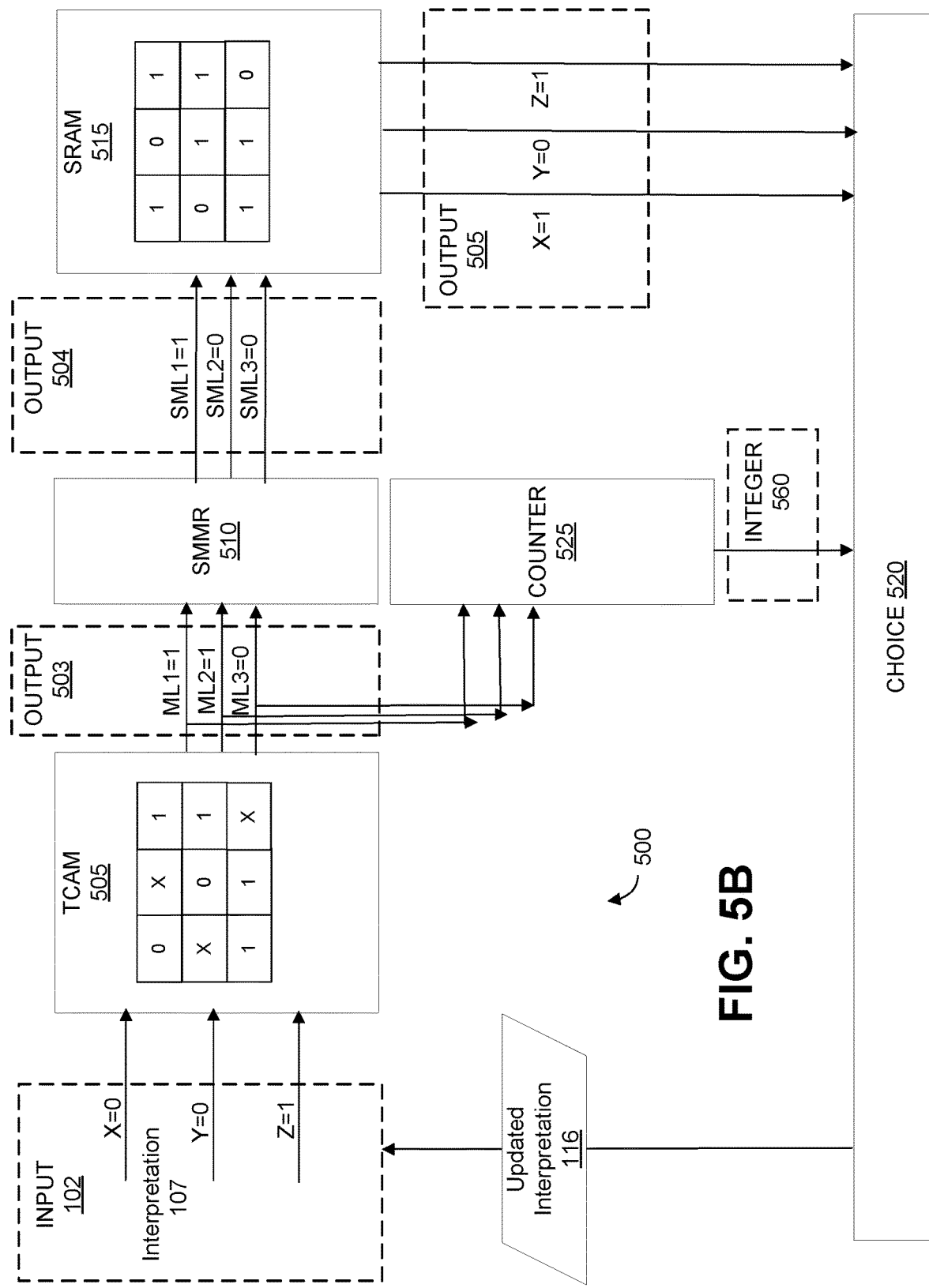

FIG. 5B shows an example architecture 500 of a K-SAT verification and solution technique, according to one embodiment. FIG. 5B includes a CNF f=$(\neg x \vee \neg y) \wedge (y \wedge \neg z) \wedge (x \vee \neg z)$ and a negated DNF $\bar{f}=(x \wedge y) \vee (\neg y \wedge z) \vee (\neg x \vee z)$. Each clause of the negated DNF $\bar{f}$ is programmed to the TCAM 505. For example, the first row includes the values [0, X, 1] which correspond to clause $(\neg x \vee z)$. The second row includes the values [X, 0, 1], which correspond to clause $(\neg y \wedge z)$. The third row includes the values [1, 1, X], which correspond to clause $(x \wedge y)$. As previously mentioned, each row includes a ML (i.e., is connected to a ML). As seen in FIG. 5B, the first row includes ML1, the second row includes ML2, and the third row includes ML3. Each ML is connected (e.g., communicatively coupled) to the SMMR 510. The SMMR 510 is connected to a plurality of SMLs (e.g., SML1, SML2, and SML3). Each SML is electrically coupled to a row of SRAM 515 memory cells. Here, the SRAM 515 includes three rows (e.e.g, a first row, a second row, and a third row). Thus, as seen in FIG. 5B, SML1 is electrically coupled to the first row of SRAM 515, SML2 is electrically coupled to the second row of SRAM 515, and SML3 is electrically coupled to the third row of SRAM 515. Each memory cell of SRAM 515 is programmed with a variable (e.g., 0 or 1). For example, as seen in FIG. 5B, the first row of the SRAM is programmed with values [1, 0, 1], the second row of the SRAM is programmed with values [0, 1, 1], and the third row of the SRAM is programmed with values [1, 1, 0].

In one example, an interpretation [0, 0, 1] is applied to the TCAM as an input 102. Since the values of the first row match the values of the interpretation, ML1 returns a value of 1 (e.g., [0, 0, 1] matches [0, X, 1] since the X value can be either 1 or 0). Furthermore, since the values of the second row match the values of the interpretation, ML2 returns a value of 1 (e.g., [0, 0, 1] matches [X, 0, 1] since the X value can be either 1 or 0). Because ML1 and ML2 are matched, the output 503 from the TCAM is a vector ML [1, 1, 0]. Once one or more MLs are matched, the SMMR 510 randomly selects one of the matched MLs (e.g., ML1), and returns a SML that corresponds to the randomly selected ML as a one hot vector. The one hot vector is sent as an output 504 to the chouce block 520. To differentiate between randomly selected and non-selected MLs, the SMMR 510 sets the selected match line (SML) to a value of 1. Here, SML1 is set to 1. The values stored in the SRAM 515 row electrically coupled to the SML1 are returned as the selected clause (e.g., the first row values [1, 0, 1]). The selected clause is then used by the WalkSAT algorithm to solve the K-SAT problem.

Figure 6:
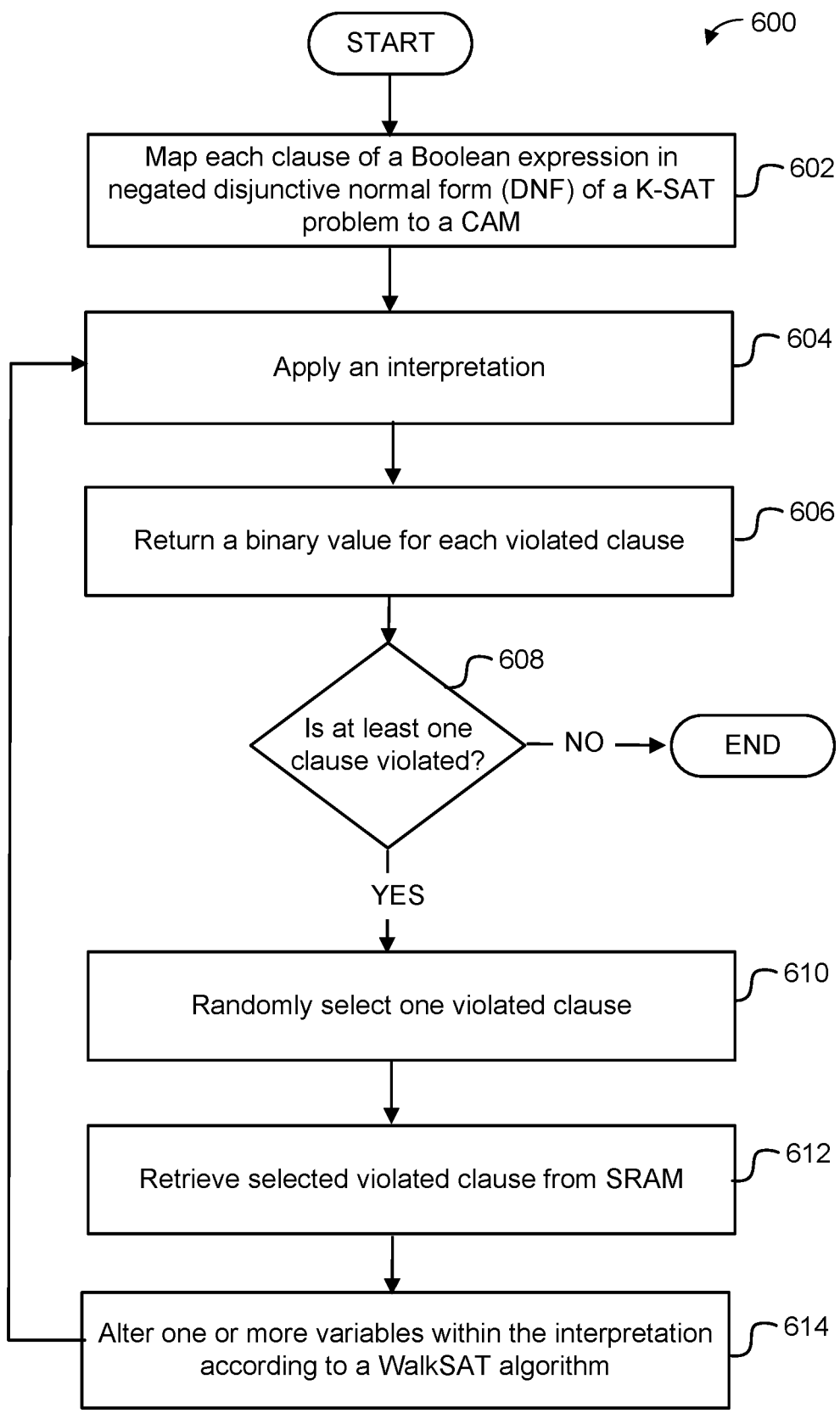
FIG. 6 is a method of solving a K-SAT problem, according to one embodiment.

FIG. 6 is a method 600 of solving a K-SAT problem, according to one embodiment. The method 600 includes mapping each clause of a Boolean expression in negated disjunctive normal form (DNF) of a K-SAT problem to a CAM, applying an interpretation, returning a binary value for each violated clause, randomly selecting (i.e., stochastically selecting) one or more violated clauses retrieving the selected violated clause from SRAM, and altering one or more variables within the interpretation according to a WalkSAT algorithm if at least one clause is violated.

At activity 602, the method 600 includes mapping each clause of a Boolean expression of a K-SAT problem, written in negated DNF, to a CAM. In one embodiment, the Boolean expression can be mapped to a four transistor, two memristor ternary CAM (i.e., 4T2M TCAM). In another embodiment, the Boolean expression can be mapped to a two transistor, two memristor ternary CAM (i.e. 2T2M TCAM). In yet another embodiment, the Boolean expression can be mapped to a three transistors, one memristor ternary CAM (i.e. 3T1M TCAM). In yet another embodiment, the Boolean expression can be mapped to a six transistor, two memristor analog CAM (i.e., 6T2M aCAM). In yet another embodiment, the Boolean expression can be mapped to a 2 Ferroelectric FET multibit CAM (2FeFET mCAM). In yet another embodiment, the Boolean expression can be mapped to a three terminal aCAM, and 16 transistor TCAM (i.e., SRAM).

Here each clause of a Boolean expression is mapped to a row of the CAM. Each literal, within each clause, is mapped to its own respective column. Each literal if further assigned a bit value (binary 0, 1, or X) depending on whether the literal is a negated, a non-negated, or absent literal not present in the clause. Here, a negated literal is assigned a bit value of 0, a non-negated literal is assigned a bit value of 1, and an absent literal is assigned a bit value of 'X' (don't care). Furthermore, each row is electrically coupled to a match line (ML).

At activity 604, the method 600 includes applying an interpretation 107 as an input to the K-SAT verification block 110. Here, the K-solver circuit 101 applies each variable of the interpretation (i.e., input) to each column in parallel to determine which clause is satisfied. A satisfied clause corresponds to a ML output equal to 0. The interpretation includes a set of variables that can be applied to the K-SAT problem to test/check if the variables satisfy all of the clauses. As previously mentioned, Boolean satisfiability problems (i.e., propositional satisfiability problems abbreviated as Satisfiability, SAT, or B-SAT) are problems to determine whether an interpretation exists to satisfy a given Boolean formula. Thus, the CAM/TCAM used for verify which clauses are satisfied by an input interpretation.

At activity 606, the method 600 includes returning a binary value for each violated clause. As previously mentioned, each row of cells in the CAM is connected to a respective match line (ML). In one embodiment, if an interpretation matches the values stored in each row, the ML coupled to that row will return a value associated with a true condition (e.g., ML returns TRUE, or a high bit value 1). If an interpretation mismatches the values stored in each row, the ML coupled to that row will return a value associated with a false condition (e.g., ML returns FALSE, or a low bit value 0). For example, if all of the values stored in each TCAM cell on a row are equal to the value given as an interpretation (i.e., input) to the SL/and SL negated then the TCAM will return a match on a given row's ML (True value). Thus, the TCAM is performing a bitwise AND operation between the XNOR of each TCAM cell's stored value and its corresponding input.

In one embodiment, if the variables do not satisfy all of the clauses, the number of violated clauses can be counted. An output 103 from the K-SAT verification block 110 can include any one of: a Boolean value 111 (e.g., a value representing True or False); an integer 112; and Boolean vector (e.g. a vector where each entries represent True or False) 113. The Boolean value 111 can be used to represent if the clause is satisfied or not. The integer 112 can be used to represent the total number of violated clauses. The Boolean vector 113 can be used to represent the index of the violated clauses, where a True value in one of the vector entries means that the corresponding TCAM row is storing a clause which is violated. As seen in FIG. 1, the output of the TCAM 505 is sent to and received by the SMMR 510.

At activity 608, the method 600 includes determining whether the clause is satisfied or violated. In one embodiment the K-SAT optimizer 115 uses the output 103 from the K-SAT verification block 110 to determine if the clause if satisfied or violated. If the clause is violated, the method includes proceeding to step 610 to update one or more variables within the interpretation. A violated clause corresponds to an ML output equal to 1. A satisfied clause corresponds to a ML output equal to 0. If the clause is satisfied (i.e., not violated), then the method ends.

At activity 610, the method 600 includes stochastically selecting one or more violated clauses. The SMMR 510 is configured to receive the output 103 from the TCAM 505. The SMMR 510 uses the output 103 from the TCAM to stochastically select one or more violated clauses. In one embodiment, the SMMR 510 uses the output 103 to randomly select one of the high match lines (MLs) to send as a vector through the bus to the SRAM 515. Specifically, once the SMMR 510 randomly selects one high match line it returns one-hot vector on a selected match line (SML). The one-hot vector is the same vector as the ML but includes only one value that is high. Thus, the SML will have only one high value. Each SML is electrically coupled to each wordline (WL) of the SRAM 515 to communicatively couple each SML to each WL.

At activity 612, the method 600 includes retrieving a selected clause from SRAM. The SRAM 515 is configured to receive the output 504 from the SMMR 510. Because each SML is communicatively coupled to each wordline (WL) of the SRAM 515, the SRAM 515 can use the output 504 to return (e.g., send) one of the violated clauses to the choice block 520. Specifically, the SRAM 515 stores the same clauses that are stored on the TCAM 505. The SRAM assigns a value of 1 if there is a variable present and 0 if there is not a variable present in the clause. Since the SML has only one active high value, that high value would be connected to a WL of the SRAM 515. Thus, the SRAM can be used to determine the variables of the clause that was stochastically selected by the SMMR. Thus the output 505 includes the selected clause (e.g., one violated clause). The output 505 is sent to the choice block 520. In one embodiment, the SRAM 515 returns (i.e., sends) output 505 as the violated clause itself.

At activity 614, the method 600 includes altering (i.e., flipping) one or more variables within the interpretation according to a WalkSAT algorithm. Here, the choice block 520 is configured to receive the output 505 from the SRAM 515 and the integer 560 from counter 525. The choice block 520 includes a circuit that is configured to use the output 505 to make a decision on which variable to alter from the selected clause. In one embodiment, the choice block uses a WalkSAT algorithm to determine which variable to alter.

The WalkSAT search algorithm alters one or more variables of the interpretation based on the output 505. In one embodiment altering one or more variables includes creating a reciprocal value and applying the reciprocal value of the variable to each clause to determine a number of violated clauses. For example, the choice block 520 can apply the WalkSAT search algorithm to a random clause to calculate how many clauses are violated by each variable when the variable is flipped. As previously mentioned, a break count exists for each variable based on the results on the flip. Thus, the break count can be used to represent how many clauses are violated by flipping that particular variable.

In one embodiment, the choice block 520 flips a variable based on the break count. Specifically, the WalkSAT algorithm starts with a random interpretation, computing unsatisfied clauses, and picking a random clause. For example, if the break count of a variable is equal to zero, then the variable is flipped. Otherwise, the choice block 520 randomly chooses between flipping the variable with a minimal break count or flipping a random variable (e.g., a random value (RND) from 0 to 1). If RND is less than a hyperparameter (P) then a random variable is flipped. Otherwise, the variable with the minimal break count is flipped. This process is repeated to determine which variables result in getting closer to the solution and which variables result in getting further from the solution. Thus, once the choice block 520 decides which variable to flip, it generates an updated (i.e., new) interpretation 116 that includes the flipped variable. The updated interpretation is then applied as an input 102 to the TCAM 505 to satisfy one or more clauses of the formula.

Figure 7:
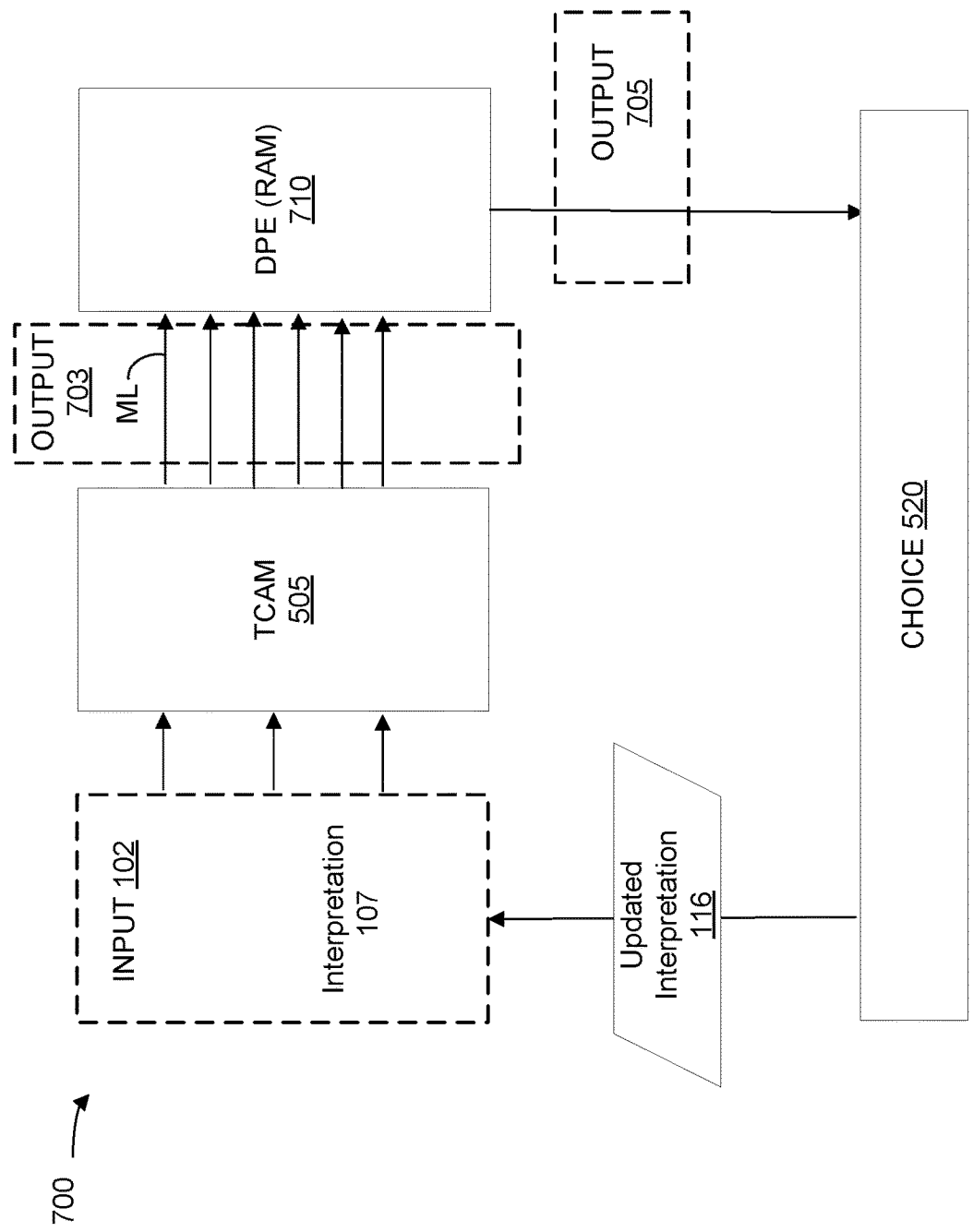
FIG. 7 shows an example architecture of a K-SAT verification and solution technique, according to one embodiment

FIG. 7 shows an example architecture 700 of a K-SAT verification and solution technique, according to one embodiment The example architecture 700 includes the ternary content-addressable memory (TCAM) 505, a dot product engine (DPE) 710, and the choice block 520. As seen in FIG. 7, the TCAM 505, DPE 710, and choice block 520 are all electrically coupled to one another respectively via a plurality of buses to create a feedback loop.

The TCAM 505 includes an array of cells that include rows and columns. Each clause of a Boolean expression of a K-SAT problem, written in negated DNF, can be mapped to a row of the TCAM, such that each column of the TCAM includes a variable. In one embodiment, non-negated literals are programmed as 1 in corresponding TCAM cells and negated literals are programmed as 0 in corresponding TCAM cells. All variables not presented in the clause are programmed as 'X' (don't care) in the corresponding TCAM cell. Each row is electrically coupled to a match line (ML).

In one embodiment, the TCAM 505 is configured to receive an input 102 from the choice block 520. The input 102 includes an interpretation 107 (e.g., guess). The interpretation includes a set of variables that can be applied to the K-SAT problem to test/check if the variables satisfy all of the clauses. Here, the TCAM 505 uses the interpretation 107 to test/check if the input variables satisfy the mapped clause. Specifically, the choice block 520 applies each variable of the interpretation (i.e., input) to each column in parallel to determine which clause is satisfied. A non-satisfied clause corresponds to a ML high value (e.g., a high order bit value) since the negated DNF is mapped all of the variables in the interpretation are matched. A satisfied clause corresponds to a ML low value (e.g., a low order bit value) since at last one variable in the interpretation is mismatched. The output 703 can include a Boolean vector 113 which represents the index of TCAM rows where a violated clause is stored.

Figure 8:
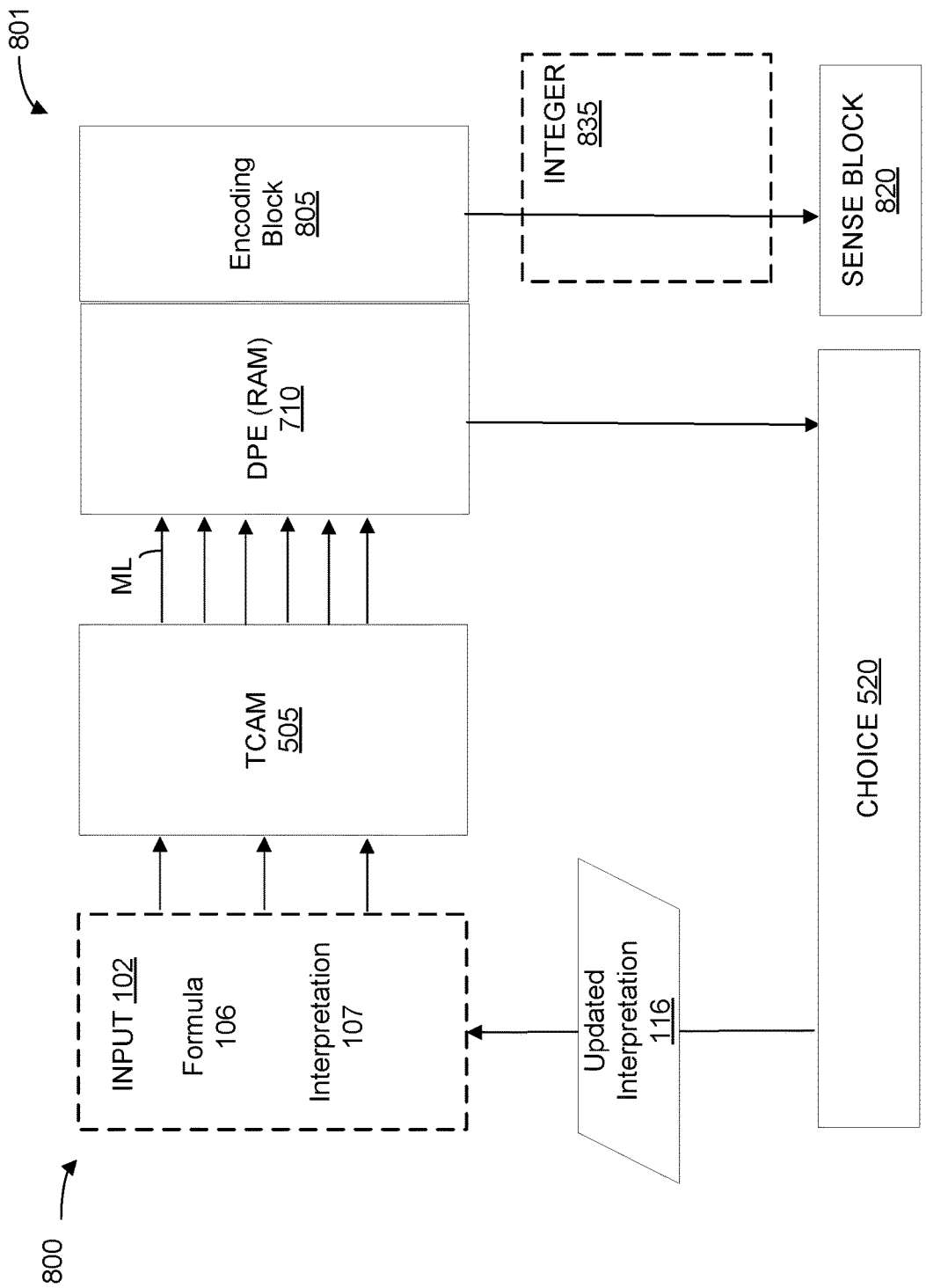
FIG. 8 shows an example architecture of a K-SAT verification and solution technique, according to one embodiment

The DPE 710 is configured to receive the output 703 from the TCAM 505. The DPE 710 uses the output 703 from the TCAM. In one embodiment, the DPE 710 includes the DPE 400 of FIG. 4 that can be used to determine the number of violated clauses by each variable. Here, DPE 710 comprises an array of resistors or memristors that can be programmed. The DPE 710 receives an input vector (e.g., the ML output from the TCAM). The DPE 710 matrix can be used to return an output 705 comprising a vector representing the number of clauses violated by each specific variable to the choice block 520. For example, if an ML is a vector having 3 elements, each element would be physically connected a row. Thus, as seen in FIG. 4, each vector element of the ML would be connected to a row 402A, 402B, 402C. Each row in the DPE 710 is multiplied according to a matrix multiplication to form an output 705 that can be returned (i.e., sent) to the choice block 520. As previously mentioned, each ML will return a high value (e.g., a high bit value 1) if the clause is violated and will return a low value (e.g., a low bit value 0) if the clause is not violated. Similarly, to the SRAM 515, the DPE assigns a value of 1 if there is a variable present and 0 if there is not a variable present in the clause. For example, for a 3-SAT problem with 10 variables if the clause includes $X_1$, $X_7$, $X_8$, the corresponding DPE row would be programmed with all 0s (e.g., $X_2$, $X_3$, $X_4$, $X_5$, $X_6$, $X_9$, and $X_{10}$,) except three 1s ($X_1$, $X_7$, $X_8$,), where there is a variable in the clause. By conducting the matrix multi-vector multiplication, using the matrix and the values stored in the RAM (i.e., DPE 710), the DPE 710 can return (i.e., send) a vector having elements (e.g., a specific frequency, or range of frequencies) the represent how many times a particular variable violated one or more clauses. For example, if variable $V_2$ violated three clauses, the output would include a vector with the number of clauses violated (e.g., 3) in the position 2 of the array. Thus, the DPE 710 can determine which variable contributes the most to violating the clauses. Specifically, the DPE 710 can determine which variable has the highest probability of not solving the problem. The DPE 710 can then return (i.e., send) an output 705 comprising a vector representing the number of clauses violated by each specific variable to the choice block 520. Here, the choice block 520 is configured to receive the output 705 from the DPE 710 and use the output 705 to make a decision on which variable to flip from the selected clause. In one embodiment, the choice block 520 is configured to flip the literal of the variable with the highest probability of not solving the problem, thereby forming a potential solution to the K-SAT problem. In one embodiment, the choice block is configured to add a random number to each element of the output 705 to add stochastically add an additional scalar to the vector addition/multiplication. In this way it is possible to avoid getting stuck in local minima, or convergence point which are not the correct solution, while performing the optimization operation FIG. 8 shows an example architecture 800 of a K-SAT verification and solution technique, according to one embodiment The example architecture 800 includes an early stop circuit 801 that includes the ternary content-addressable memory (TCAM) 505, the dot product engine (DPE) 710, an encoding block 805, a sense block 820, and the choice block 520. The TCAM 505, DPE 710, and choice block 520 are all electrically coupled to one another respectively via a plurality of buses to create a feedback loop.

In this embodiment, the early stop circuit 801 is configured to determine when to stop the K-SAT problem solving operation (i.e., when iterations of deciding which variable to flip from the selected clause are complete). As found in FIG. 7, a matrix multi-vector multiplication is conducted with the rows of the DPE 710. However, in this embodiment, each row is programmed with an additional 1 in an extra column. Thus, the integer 835, which represents the total number of violated clauses, can be obtained without requiring a new circuit block. For example, by adding just one additional column to the DPE 710, it is possible to obtain the integer 835 which represents the total number of violated clauses, thus replacing the need for the counter 525 of FIG. 5. By applying a sensing operation on the memory cells, the sense block can determine when the K-SAT problem solving operation should be complete. Here, the encoding block 805 encodes an additional 1 in each row as a marker to signal the end of the solution process. Computing an additional (e.g., extra) column of the DPE 710 in each row does not alter the operation of the other columns of DPE 710. Thus, the number of violated clauses can be determined without altering the matrix multi-vector multiplication. When the integer 835 is equal to 0, the K-SAT problem is solved, and the circuit can stop. In one embodiment, the sense block 820 senses for a 0 integer 835 value. For example, if the integer 835 was a 0 value, the sense block 820 would determine that the K-SAT problem is solved and stop the circuit. In one embodiment, stopping the circuit includes terminating the process of the feedback loop.

Figure 9:
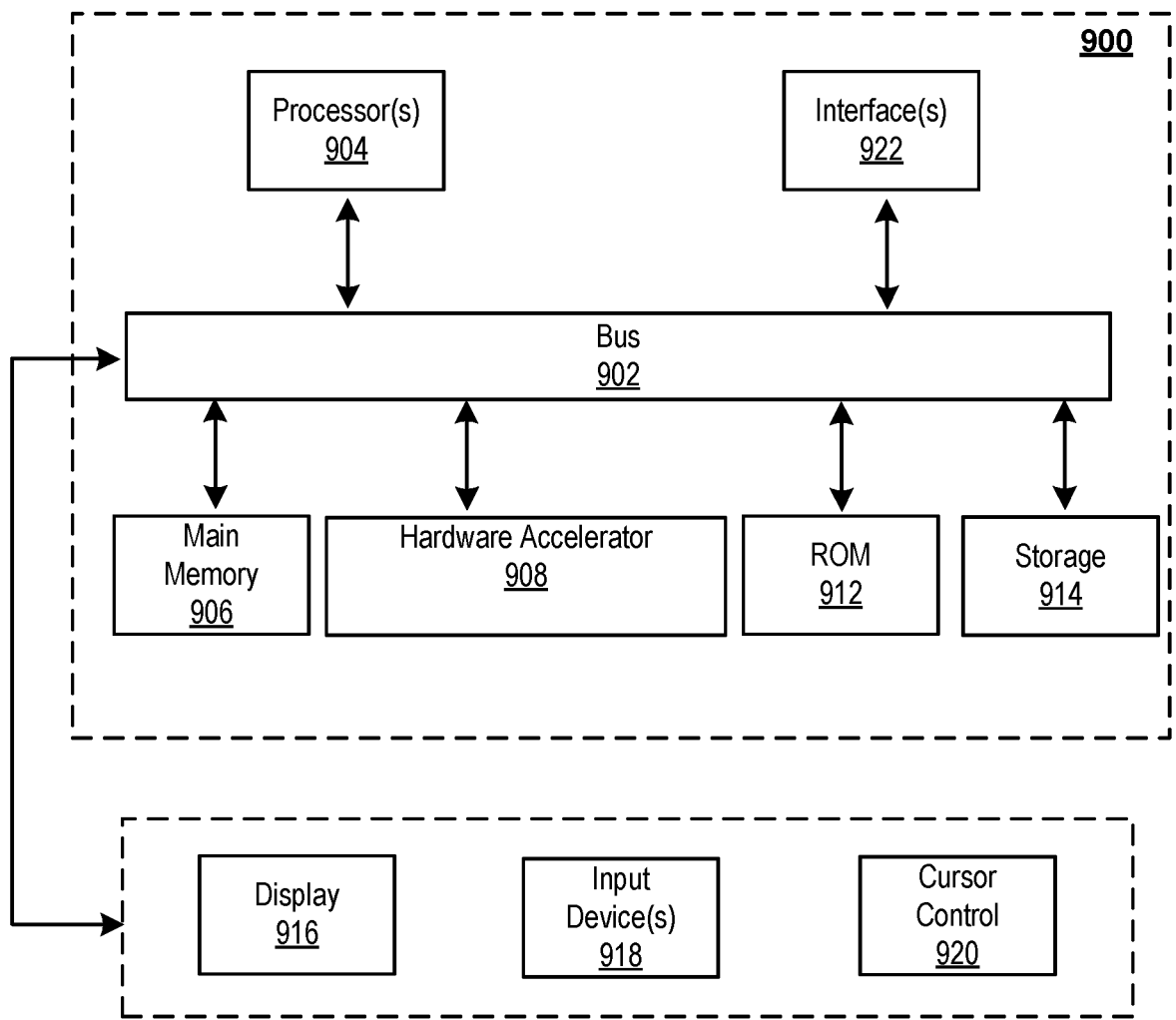
FIG. 9 is an example computing component that may be used to implement various features of example embodiments of the invention.

FIG. 9 depicts a block diagram of an example computer system 900 in which various of the embodiments described herein may be implemented. For example, in one embodiment, the k-solver can be implemented as computer system 900. The computer system 900 includes bus 902 or other communication mechanism for communicating information, one or more hardware processors 904 coupled with bus 902 for processing information. Hardware processor(s) 904 may be, for example, one or more general purpose microprocessors.

Computer system 900 also includes main memory 906, such as a random access memory (RAM), cache and/or other dynamic storage devices, coupled to bus 902 for storing information and instructions to be executed by processor 904. Main memory 906 also may be used for storing temporary variables or other intermediate information during execution of instructions to be executed by processor 904. Such instructions, when stored in storage media accessible to processor 904, render computer system 900 into a special-purpose machine that is customized to perform the operations specified in the instructions.

Computer system 900 additionally includes hardware accelerator 908. Hardware accelerator 908 may be configured to execute instructions (i.e. programming or software code) stored in the main memory 906, read-only memory (ROM) 912, and/or storage device 914 to encode a set of logical rules embodied in a data structure into the CAM. In an example implementation, the exemplary hardware accelerator 908 may include multiple integrated circuits, which in turn, can include Application-Specific Integrated Circuits (ASICs), Field Programmable Gate Arrays (FPGAs) or other Very Large Scale Integrated circuits (VLSIs). The integrated circuits of the exemplary hardware accelerator 908 may be specifically optimized to perform a discrete subset of computer processing operations, or execute a discrete subset of computer-executable instructions, in an accelerated manner.

The CAM may include a non-volatile memory built using technologies that include for instance, resistive switching memory (i.e. memristor), phase change memory, magneto-resistive memory, ferroelectric memory, some other resistive random access memory device (Re-RAM), or combinations of those technologies. More generally, the CAM may be implemented using technologies that permit CAM to hold its contents even when power is lost or otherwise removed. Thus, data in the CAM "persists" and the CAM can act as what is known as a "non-volatile memory."

Computer system 900 further includes read only memory (ROM) 912 or other static storage device coupled to bus 902 for storing static information and instructions for processor 904. Storage device 914, such as a magnetic disk, optical disk, or USB thumb drive (Flash drive), etc., is provided and coupled to bus 902 for storing information and instructions.

Computer system 900 may be coupled via bus 902 to display 916, such as a liquid crystal display (LCD) (or touch screen), for displaying information to a computer user. Input device 918, including alphanumeric and other keys, is coupled to bus 902 for communicating information and command selections to processor 904. Another type of user input device is cursor control 920, such as a mouse, a trackball, or cursor direction keys for communicating direction information and command selections to processor 904 and for controlling cursor movement on display 916. In some embodiments, the same direction information and command selections as cursor control may be implemented via receiving touches on a touch screen without a cursor.

The computing system 900 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

Computer system 900 may implement the techniques described herein using customized hard-wired logic, one or more ASICs or FPGAs, firmware and/or program logic which in combination with the computer system causes or programs computer system 900 to be a special-purpose machine. According to one embodiment, the techniques herein are performed by computer system 900 in response to processor(s) 904 executing one or more sequences of one or more instructions contained in main memory 906. Such instructions may be read into main memory 906 from another storage medium, such as storage device 914. Execution of the sequences of instructions contained in main memory 906 causes processor(s) 904 to perform the process steps described herein. In alternative embodiments, hard-wired circuitry may be used in place of or in combination with software instructions.

The term "non-transitory media," and similar terms such as machine-readable storage media, as used herein, refers to any media that store data and/or instructions that cause a machine to operate in a specific fashion. Such non-transitory media may comprise non-volatile media and/or volatile media. Non-volatile media includes, for example, optical or magnetic disks, such as storage device 914. Volatile media includes dynamic memory, such as main memory 906. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 902. Transmission media can also take the form of acoustic or light waves, such as those generated during radio-wave and infra-red data communications.

Computer system 900 also includes a communication interface 922 coupled to bus 902. Communication interface 922 provides a two-way data communication coupling to one or more network links that are connected to one or more local networks. For example, communication interface 922 may be an integrated services digital network (ISDN) card, cable modem, satellite modem, or a modem to provide a data communication connection to a corresponding type of telephone line. As another example, communication interface 922 may be a local area network (LAN) card to provide a data communication connection to a compatible LAN (or WAN component to communicate with a WAN). Wireless links may also be implemented. In any such implementation, communication interface 922 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 922, which carry the digital data to and from computer system 900, are example forms of transmission media.

Computer system 900 can send messages and receive data, including program code, through the network(s), network link and communication interface 922. In the Internet example, a server might transmit a requested code for an application program through the Internet, the ISP, the local network and the communication interface 922. The received code may be executed by processor 904 as it is received, and/or stored in storage device 914, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 900.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A computer-implemented method comprising:
   programming, by a processor, one or more clauses of a Boolean expression for a K-Satisfiability (K-SAT) problem written in negated disjunctive normal form (DNF) to a ternary content addressable memory (TCAM) array comprising columns and rows of TCAM cells, wherein each clause of the Boolean expression is programmed to a respective row of the TCAM array, and wherein each occurring variable of each clause is mapped to a respective TCAM cell of the row, and wherein each non-occurring variable is programmed as a don't care value;
   applying, by the processor, an interpretation comprising one or more binary variables expected to solve the Boolean expression as an input along the columns to the TCAM array;
   returning, by the processor, a binary value for each clause;
   randomly, by the processor, selecting one matched match line;
   determining, by the processor, a selected clause from one or more violated clause; and
   altering, by the processor, one or more literals within the interpretation using a break count for each variable of the selected clause.

2. The computer-implemented method of claim 1, wherein programming each clause of the Boolean expression for the K-SAT problem written in DNF includes programming a bit value that includes a 0, 1, or X to each cell within each TCAM array, wherein the X represents a don't care value.

3. The computer-implemented method of claim 2, wherein each negation of each literal in each clause is assigned a bit value of 0, each non-negation of each literal in each clause is assigned a bit value of 1, and each absent variable in each clause is assigned a bit value of X.

4. The computer-implemented method of claim 1, wherein each match line returns a high bit value if the interpretation violates the clause stored in a corresponding row of the TCAM array, and wherein each match line returns a low bit value if the interpretation satisfies the clause stored in the corresponding row of the TCAM array.

5. The computer-implemented method of claim 4, wherein a stochastic multiple match resolver (SMMR) randomly selects one high bit value from a match line Boolean vector to return a one hot vector that includes only one high value, and wherein the SMMR sets all non-selected match lines in the Boolean vector to zero.

6. The computer-implemented method of claim 5, wherein the one hot vector is sent to a static random-access memory (SRAM).

7. The computer-implemented method of claim 6, wherein each row of the SRAM is programmed with each clause of the Boolean expression for the K-SAT problem.

8. The computer-implemented method of claim 1, further comprising:
   applying, by the processor, a Walk-Satisfiability (WalkSAT) algorithm to the selected clause, wherein the WalkSAT algorithm is used to determine the break count for each variable by applying an altered state of each variable as an interpretation to each clause.

9. The computer-implemented method of claim 2, wherein the break count is determined by altering a variable to create a reciprocal value and applying the reciprocal value of the variable to each clause to determine a number of violated clauses.

10. A computer-implemented method of solving a K-Satisfiability (K-SAT) problem using a content addressable memory (CAM) comprising:
    programming, by a processor, one or more clauses of a Boolean expression for a K-SAT problem written in negated disjunctive normal form (DNF) to a ternary-CAM (TCAM) array comprising columns and rows of TCAM cells, wherein each clause of the Boolean expression is programmed to a respective row of the TCAM array, and wherein each occurring variable of each clause is mapped to a respective TCAM cell of the row, and wherein each non-occurring variable is programmed as a don't care value;
    applying, by the processor, an interpretation comprising one or more binary variables expected to solve the Boolean expression as an input along the columns to the TCAM array;
    returning, by the processor, a binary value for each violated clause;
    applying, by the processor, a matrix multi-vector multiplication to one or more values stored in a dot product engine (DPE) to determine which variable contributes most to each violated clause; and
    altering, by the processor, one or more literals within the interpretation based on which variable contributes most to each violated clause.

11. The computer-implemented method of claim 10, wherein the DPE assigns a value of 1 for every variable present within a clause and a value of 0 for every variable not present with in the clause.

12. The computer-implemented method of claim 10, further comprising:

using, by the processor, a sensing operation to determine when to terminate alteration of one or more literals within the interpretation, wherein the sensing operation senses for an additional encoded 1 in each row of the DPE.

13. The computer-implemented method of claim 10, wherein the one or more literals include a variable or a negation of a variable, and wherein the one or more literals within the interpretation are altered using a choice block that is configured to use a break count to determine which one of the one or more literals within the interpretation to alter.

14. The computer-implemented method of claim 10, further comprising:
stochastically selecting, by the processor, one or more violated clause index, wherein the index corresponds to a Boolean value true in a vector returned from the TCAM.

15. A circuit for solving a K-Satisfiability (K-SAT) problem comprising:
a ternary content addressable memory (TCAM) configured to determine whether an interpretation comprising one or more clauses of a Boolean expression, written in negated disjunctive normal form (DNF), is satisfied;
a stochastic multiple match resolver (SMMR) communicatively coupled to the TCAM, wherein the SMMR is configured to randomly select one high value match line from one or more high value match lines communicatively coupled to each row of the TCAM; and
a static random access memory (SRAM), communicatively coupled to the SMMR, wherein the SRAM is configured to return a violated clause to a choice block.

16. The circuit of claim 15, wherein the choice block is configured to apply each variable of the interpretation to each row of a TCAM to determine which clause is satisfied.

17. The circuit of claim 15, wherein the SMMR is configured to return one-hot vector that includes only one dimension representing a high value.

18. The circuit of claim 15, wherein each high value from a match line represents a violated clause.

19. A non-transitory computer readable storage medium storing instructions that, when executed by a processor, cause the processor to:
program one or more clauses of a Boolean expression for a K-Satisfiability (K-SAT) problem written in negated disjunctive normal form (DNF) to a ternary content addressable memory (TCAM) array comprising columns and rows of TCAM cells, wherein each clause of the Boolean expression is programmed to a respective row of the TCAM array, and wherein each occurring variable of each clause is mapped to a respective TCAM cell of the row, and wherein each non-occurring variable is programmed as a don't care value;
apply a first interpretation, comprising one or more binary variables expected to solve the Boolean expression, as an input along the columns to the TCAM array;
return a binary value for each clause;
randomly select one or more violated clause index;
determine a break count for each variable of one violated clause; and
alter one or more variables within the first interpretation if at least one clause of the Boolean expression is not satisfied.

20. The non-transitory computer readable storage medium of claim 19, wherein one or more literals within the interpretation are altered using a choice block that is configured to use the break count to determine which variable or negation of a variable to alter to an inverse form.

* * * * *